(12) United States Patent
Kenn et al.

(10) Patent No.: US 6,583,380 B2
(45) Date of Patent: Jun. 24, 2003

(54) DEVICE AND METHOD FOR MARKING COPPER-CLAD LAMINATES

(75) Inventors: Christoph Kenn, Duren (DE); Theo Schumacher, Duren (DE)

(73) Assignee: Isola AG, Duren (DE)

( * ) Notice: Subject to any disclaimer, the term of this patent is extended or adjusted under 35 U.S.C. 154(b) by 0 days.

(21) Appl. No.: 09/863,714

(22) Filed: May 23, 2001

(65) Prior Publication Data

US 2001/0047985 A1 Dec. 6, 2001

(30) Foreign Application Priority Data

May 27, 2000 (DE) ......................................... 100 26 499

(51) Int. Cl.$^7$ ............................................... B23K 26/00
(52) U.S. Cl. ................................................. 219/121.68
(58) Field of Search ........................ 219/121.6, 121.68, 219/121.69, 121.65, 121.66, 121.82, 121.85

(56) References Cited

U.S. PATENT DOCUMENTS

| | | | | |
|---|---|---|---|---|
| 4,734,558 A | * | 3/1988 | Nakano et al. | ........ 219/121.67 |
| 5,817,243 A | * | 10/1998 | Shaffer | ........................ 216/65 |
| 5,828,491 A | * | 10/1998 | Neuman et al. | ............. 359/565 |
| 5,835,249 A | * | 11/1998 | Yamada et al. | ............. 359/201 |
| 6,172,328 B1 | * | 1/2001 | Jones et al. | ............ 219/121.68 |

FOREIGN PATENT DOCUMENTS

| | | | | |
|---|---|---|---|---|
| DE | 41 06 151 A1 | | 11/1991 | |
| JP | 60000979 A | * | 1/1985 | .............. 219/121.6 |
| WO | WO9725177 | * | 7/1997 | .............. 219/121.6 |

OTHER PUBLICATIONS

Lenk, "Barcode auf Leiterplatten", productronic 8/9 pp. 32–33, 1996.

* cited by examiner

Primary Examiner—Samuel M. Heinrich
(74) Attorney, Agent, or Firm—McDonnell Boehnen Hulbert & Berghoff

(57) ABSTRACT

A device for marking copper-clad laminates comprises a laser (10), in whose resonator (12) there is an intensity-controlling screen (24), an expanding lens (26) for expanding the laser beam (18) and a focusing lens (30) for focusing the expanded laser beam (28) on the surface of a workpiece (32) in the form of a copper-clad laminate. In the corresponding method for marking copper-clad laminates a laser beam (18) is expanded, and the expanded laser beam (28) is focused on the surface of a workpiece (32) in the form of a copper-clad laminate, with the laser intensity inside laser resonator (12) being controlled by a screen (24).

13 Claims, 5 Drawing Sheets

DEVICE AND METHOD FOR MARKING COPPER-CLAD LAMINATES

This invention relates to a device and a method for marking copper-clad laminates.

Copper-clad laminates are used as a base material in the production of printed circuit boards. The latter are made from electrically high-insulating laminated materials provided with copper cladding, i.e. a copper coating. As a general rule, the intermediate layer consists of a glass-cloth laminate with a resin matrix, e.g. of epoxy resin. The intermediate layer can also be manufactured from e.g. a glass-fibre mat, an aramide fabric or fleece, or also from a phenolic paper laminate.

A workpiece comprising a copper-clad laminate is processed in the known manner into a printed circuit by etching away parts of the copper coating so that the remaining copper surfaces form the desired conductive pattern on top of the insulating intermediate layer.

Before processing, it is desirable to mark the workpieces so that they can be clearly identified. For this purpose it is customary to mark the workpieces by stamping a symbol at some point which is not processed in the operation to manufacture the circuit board as described above. As a result, however, the copper laminate ends up permanently mechanically deformed. This deformation, which may appear for example in a marked corner of the workpiece, is highly undesirable for the subsequent processing. Furthermore, a relatively long marking device change-over time is involved whenever a change of symbol is required. It is also difficult to carry out the marking operation in such a way that the marked symbol remains visible on the intermediate layer even after the copper layer has been etched away.

The task of this invention is therefore to provide a method and a device for marking copper-clad laminates which overcome the disadvantages described above.

This task is solved according to the invention by means of the device of claim 1 and the method of claim 9.

The device according to the invention is equipped with a laser, in whose resonator there is a screen with which the intensity of the generated laser beam can be controlled. The laser beam emitted by the resonator is initially expanded by an expanding lens such as a diverging lens, for example, and then focused on the surface of the copper-clad laminate workpiece to be marked using a focusing lens such as a convergent lens.

At the focal point of the convergent lens the copper surface of the laminate is heated and vaporized by the laser beam so that the intermediate layer of the laminate is exposed. The surface of the epoxide material of the intermediate layer is carbonized by the heat, i.e. carbon compounds are formed at the surface, which blackens as a result.

This process requires a very high laser intensity, because copper is extremely heat-conducting and the necessary temperatures at the focal point are difficult to attain. This is why the focal point generated has to be very small. This is the reason why the laser beam is first expanded before being focused. With an expansion of around factor 6, for example, it is possible to obtain a focus diameter of less than 50 m. On the other hand, the laser intensity has to be appropriately dosed to avoid the intermediate layer from being burnt through together with the top copper layer. This purpose is served by the screen disposed in the resonator. By adjusting the size of the screen the intensity of the generated laser beam can be dosed very accurately.

The desired marking can therefore be created by scanning the workpiece with the laser. For this purpose the optical components of the device are advantageously grouped together to form a scanning head which moves over the workpiece surface.

The advantage of the device of the invention is that the workpiece is not deformed during the marking process, and no problems occur in this respect during further processing. Neither is there any need for any change-over operation on the marking device as simple reprogramming of the device is all that is required to change the symbol as desired. This is extremely time-saving compared with the prior art method. Furthermore, the burnt-in symbol endures even after the copper layer has been etched away.

Aside from the process for marking the intermediate layer of the laminate as described above, it is also possible to mark only the surface of the copper layer by using a lower intensity. The copper is oxidized and blackened by the heat. Given that here, too, the problem remains one of obtaining the highest possible intensities at the focal point, it is again indispensable to expand the beam and control the intensity by means of the screen.

The laser is preferably operated in a pulsed manner, i.e. pulses of light of high intensity are generated. In this case the average intensity can be determined in relation to an interval of time by controlling the pulse frequency, because the average intensity increases with the density of the sequence of pulses. The pulse frequency is preferably controlled by an audio-optical modulator disposed inside the resonator. It is also possible to control the intensity in the usual way via the laser lamp current.

In one preferred embodiment, the marking device is provided with a clamping device for fixing the area of the workpiece to be marked in the focal plane. In this case it is important that, during the marking operation, the workpiece surface to be marked is held sufficiently accurately in the focal plane to ensure that the intensity is satisfactory, and that a sharp pattern is created. In one preferred embodiment the clamping device comprises a stationary table against which the workpiece or the area to be marked rests, and a frame-like—i.e. provided with an opening—pressure plate which can be moved in relation to the table. The surface of the workpiece to be marked is rested on the table and fixed in place against the table by moving the pressure plate so that the marking process can take place through the opening in the pressure plate.

A charging device preferably serves to move the workpiece into the marking position, and for the subsequent removal of the marked workpiece. In one preferred embodiment the charging device is comprised of two roller conveyors which are disposed along a plane and transport the workpiece in two directions oriented perpendicular to each other. In this case the marking position can be advantageously defined in that the transport paths of the roller conveyors are each limited in a transport direction by stopper elements. This means that the workpiece is initially moved against a first stopper element on one roller conveyor so that the marking position is defined in this direction, after which it is moved against a second stopper element by the second roller conveyor in the direction perpendicular thereto. The marking position is thus quite clearly defined in the plane of motion.

A method for marking copper-clad laminates with the device of claim 1 is described in claim 9. Advantageous embodiments of this method are indicated in the sub-claims 10 to 13.

A preferred example of an embodiment will be explained in more detail below with reference to the drawings, in which FIG. 1 shows a diagrammatic representation of the optical components of a marking device according to the invention;

Figure 1:
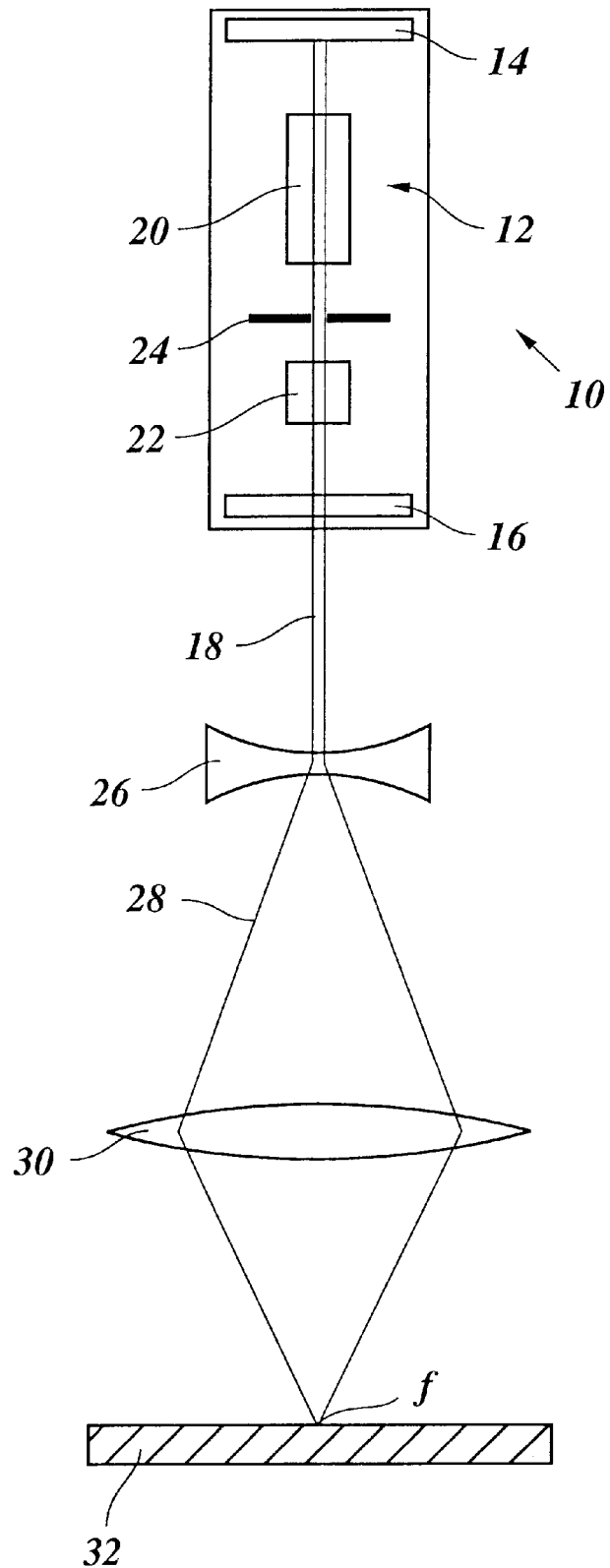

FIG. 1 illustrates the optical construction of the device according to the invention for marking copper-clad laminates. A laser 10 comprises a resonator 12 with a completely reflecting mirror 14 and a partially penetrable mirror 16, through which the laser beam 18 generated in resonator 12 is emitted. Resonator 12 accommodates the active medium 20, in this case an Nd:YAG crystal, which is stimulated in a manner not shown in more detail, e.g. by flash tubes, to initiate the laser process. Resonator 12 also comprises an audio-optical modulator 22, which enables laser 10 to be operated in a pulsed manner. Between active medium 20 and audio-optical modulator 22 there is a screen 24, with which part of the intensity reflected between mirrors 14,16 can be screened. Thus the intensity of laser beam 18 can be controlled by either enlarging or reducing the opening of screen 24. It is also possible to control the intensity by controlling the pulse frequency of the audio-optical modulator 22 or by altering the lamp current of the flash tubes.

The laser beam 18 emitted by laser 10 is directed onto a diverging lens 26, which expands beam 18. The expanded conical beam 28 then impacts on a convergent lens 30, which focuses the laser beam at a focal point f on the surface of the diagrammatically represented workpiece 32.

Diverging lens 26 and convergent lens 30 basically form a telescope. By expanding and then focusing beam 18 through the telescope it is possible to obtain a very small focus, f, so that the surface intensity on the surface of workpiece 32 is very high. Where the focal distance of convergent lens 30 is 240 mm, an expansion of about factor 6 gives a focus diameter of less than 50 m, for example. Intensities as high as this make it possible to mark copper-clad laminates in line with the principles explained below in connection with FIGS. 5 and 6.

Figure 2:
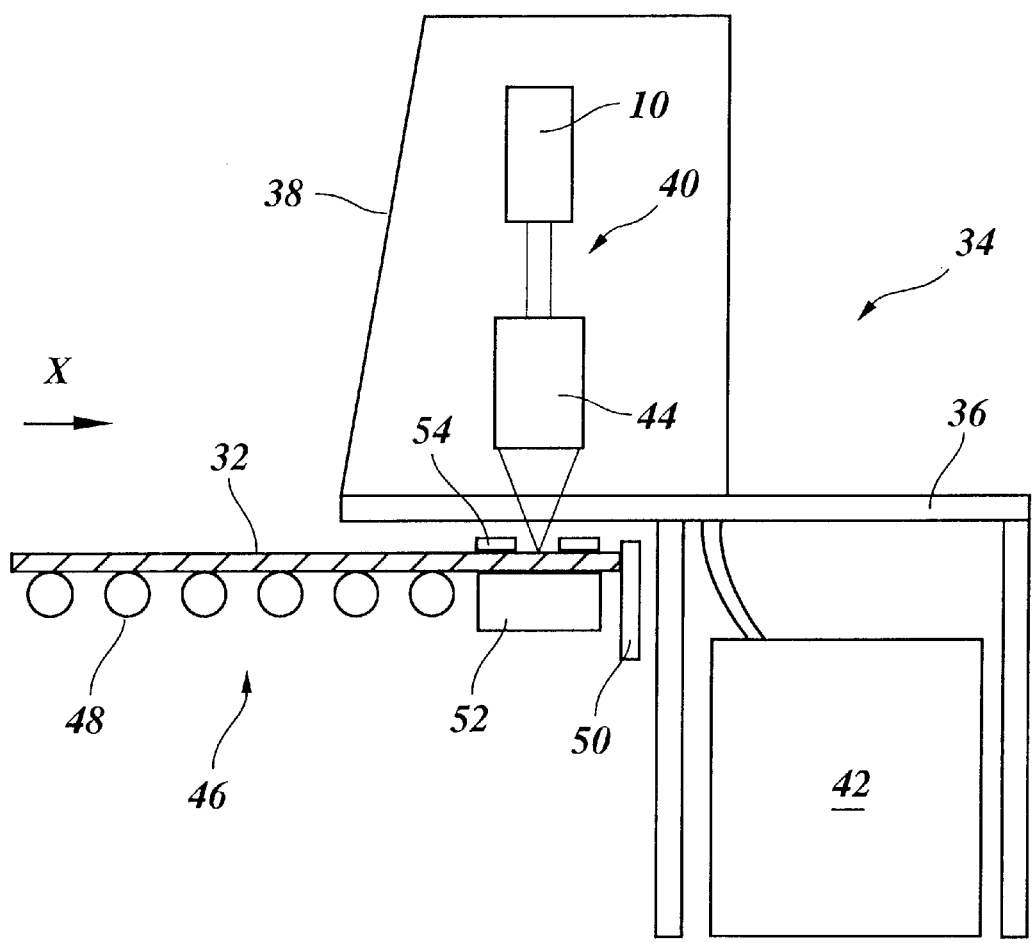
FIG. 2 shows a diagrammatic side view of a marking device with the components of FIG. 1.

The device in FIG. 2 comprises a laser marking appliance 34 with a laser head 40 mounted on a machine frame 36 inside a protective cabin 38, and a supply unit 42 containing in particular a voltage supply and cooling water for laser head 40. The diagrammatically represented laser head 40 consists of the arrangement shown in FIG. 1, namely laser 10 and telescope 44 with the two lenses 26,30. If necessitated by the arrangement, laser head 40 can include other optical components such as mirrors or similar objects.

The marking device of FIG. 2 also comprises a charging device 46 which is only partially represented in FIG. 2, and a roller conveyor 48 on which a workpiece 32 to be transported rests flat. Roller conveyor 48 transports workpiece 32 in the direction shown by arrow X until the leading edge of workpiece 32 abuts against a stopper element 50. In this way the marking position of workpiece 32 is defined in direction X.

In the marking position, the right edge portion of workpiece 32 as shown in FIG. 2 lies in the gap between a stationary table 52 disposed underneath laser head 40 and a pressure plate 54 disposed over it at a distance. Pressure plate 54 is frame-like, i.e. it has an opening in the middle which defines a marking zone. It is customary to have square marking zones with the dimensions 160 mm×160 mm, for example.

By means of a vertical movement of pressure plate 54 towards table 52, which can be effected by a pneumatic drive, for example, workpiece 32 is held in place between table 52 and pressure plate 54 in such a way that the surface of workpiece 32 lies in the focal plane of telescope 44. In this manner the beam 18 of laser 10 is focused through the opening in pressure plate 54 onto the surface of workpiece 32, as already explained in connection with FIG. 1. As the position of the focal point, f, on the surface has to be altered to carry out the marking operation, laser head 40 can be moved along the horizontal plane in a manner that is not shown. It is particularly advantageous to group together a part of the optical components of laser head 40 to form a scanner unit, and to move only the scanner unit, so that laser 10 in particular remains stationary.

Figure 3:
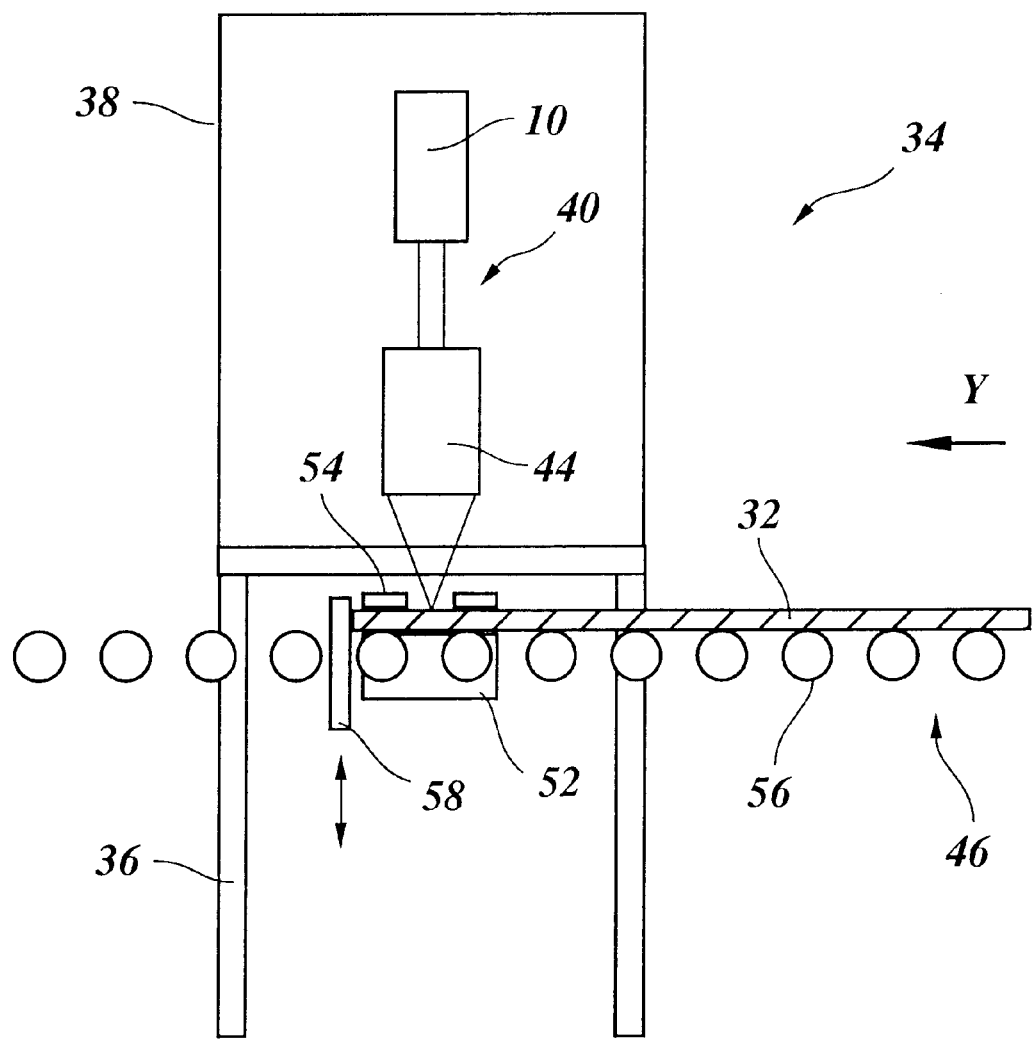
FIG. 3 shows a front view of the marking device of FIG. 2.
Figure 4:
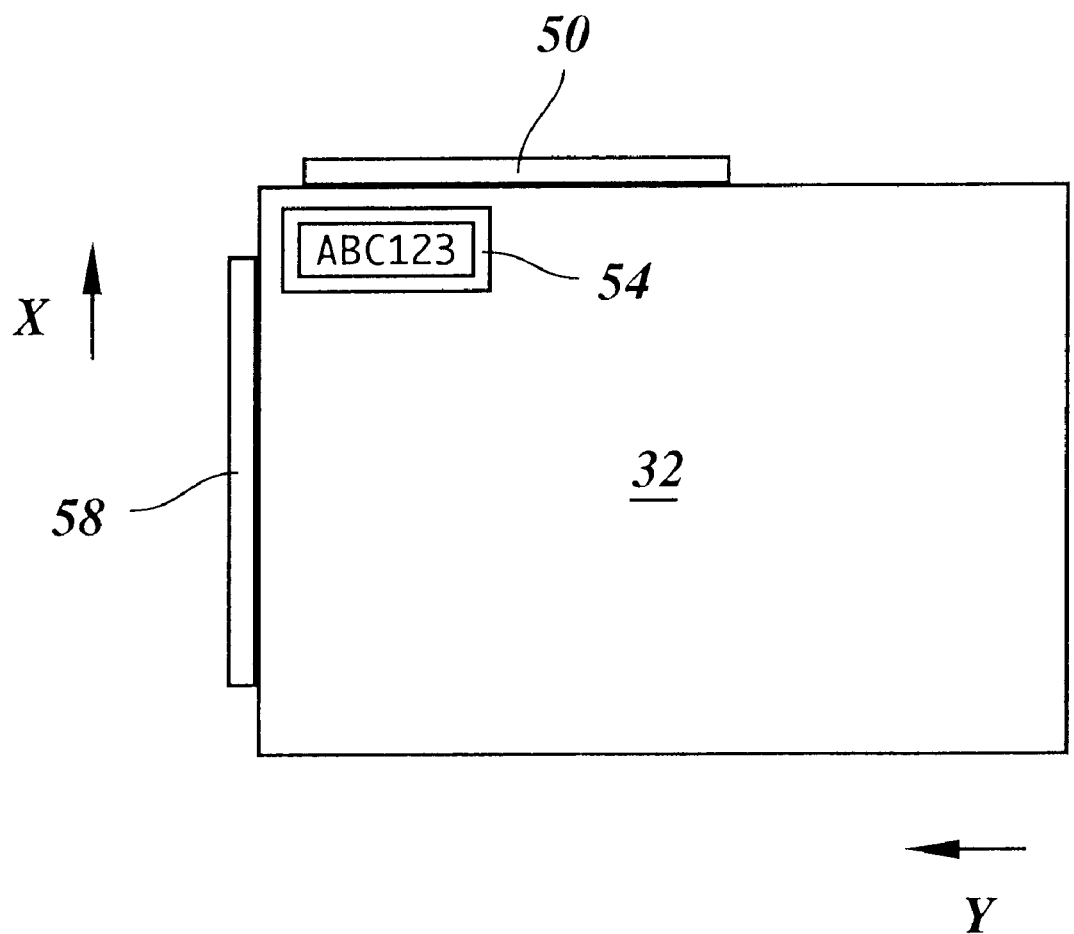
FIG. 4 is a diagram explaining the manner in which the charging device functions.

FIG. 3 shows other components of charging device 46, namely another roller conveyor 56 which runs perpendicular to roller conveyor 48 shown in FIG. 2 and serves to transport workpiece 32 in direction Y, perpendicular to direction X. In direction Y, workpiece 32 also abuts against a vertically displaceable stopper element 58, which defines the marking position in this direction Y. As shown in FIG. 4, the charging operation takes place as follows: workpiece 32 is initially transported via the roller conveyor 56 shown in FIG. 3 to underneath laser head 40, up to stopper element 58. It is then transported by the second roller conveyor 48 shown in FIG. 2 in the direction perpendicular thereto, X, towards stopper element 50. It has now reached its marking position in which the area to be marked is held in place by table 52 and pressure plate 54, and the marking operation is carried out by focusing laser beam 18 and moving laser head 40. At the end of the marking operation pressure plate 54 is lifted to release workpiece 32, stopper element 58 is moved downwards and workpiece 32 can be transported out of the marking device in direction Y. The work cycle can then be repeated with another workpiece.

Figure 5:
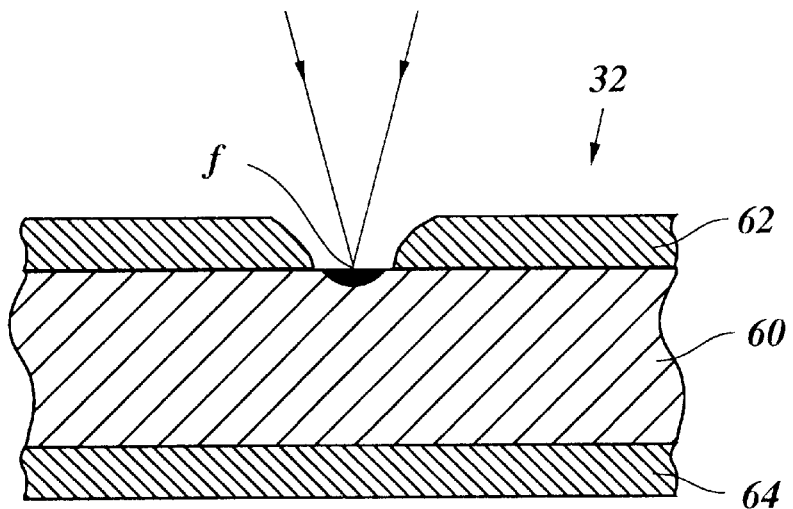
FIGS. 5 and 6 are sections through a workpiece to be marked, which show the manner in which the marking device of the invention functions.

FIG. 5 explains the operating principle of the marking method according to the invention. The section through workpiece 32 shows an intermediate layer 60 made from epoxy resin which serves as a substrate for two layers of copper 62,64, which form the surfaces of workpiece 32. By focusing conical laser beam 28 through lens 30, the copper surface 62 is heat strongly so that the copper is vaporized resp. oxidized and is removed by its own vapour pressure. The surface of substrate 60 is exposed in this way. The latter is heated too, so that a chemical reaction takes place and black carbon compounds are formed at the surface. This blackening is how intermediate layer 60 is marked. If the copper layers 62,64 are removed from the substrate in a subsequent processing step, the marking remains on intermediate layer 60.

Figure 6:
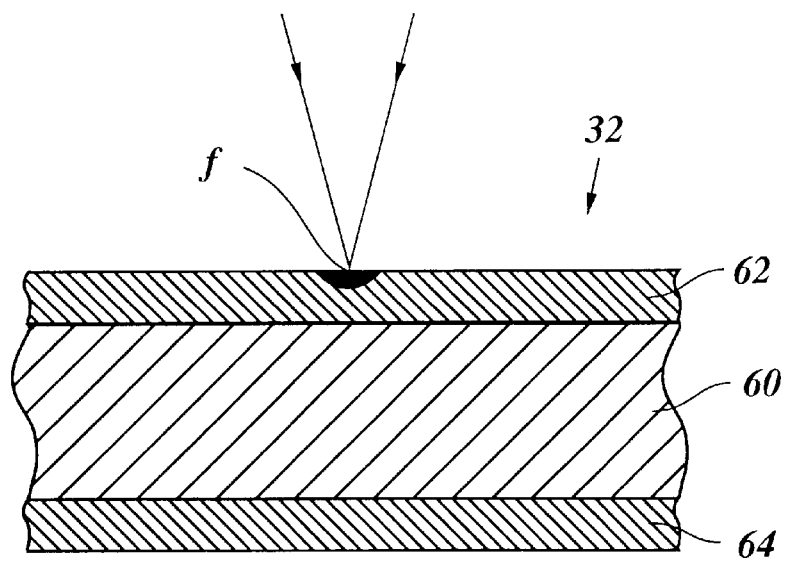

FIG. 6 shows the marking operation at lower laser intensities. In this case the intensity is not sufficient to vaporize the copper layer 62; the copper surface is merely oxidized, which also results in blackening.

What is claimed is:

1. A device for marking copper-clad laminates, characterized by a laser (10), in whose resonator (12) there is an intensity-controlling screen (24), an expanding lens (26) for expanding the laser beam (18) and a focusing lens (30) for focusing the expanded laser beam (28) on the surface of a workpiece (32) in the form of a copper-clad laminate.

2. The device of claim 1, characterized in that laser (10) is intended to be operated in pulsed mode.

3. The device of claim 2, characterized in that an audio-optical modulator (22) is disposed inside resonator (12) for pulsing laser (10).

4. The device of claim 1, characterized by a clamping device (52,54) for holding workpiece (32) in the focal plane of focusing lens (30).

5. The device of claim 4, characterized in that the clamping device (52,54) comprises a stationary table (52) on which workpiece (32) rests and a frame-like pressure plate (54) which can be moved towards table (52).

6. The device of claim 1, characterized by a charging device (46) for moving workpiece (32) into the marking position and for removing the marked workpiece (32).

7. The device of claim 6, characterized in that the charging device (46) comprises two roller conveyors (48,56) for transporting workpiece (32) in two perpendicular directions (X,Y).

8. The device of claim 7, characterized in that for the purpose of defining the marking position, the transport paths of roller conveyors (48,56) are limited by stopper elements (50,58).

9. A method for marking copper-clad laminates, characterized in that a laser beam (18) is expanded, and the expanded laser beam (28) is focused on the surface of a workpiece (32) in the form of a copper-clad laminate, with the laser intensity inside laser resonator (12) being controlled by a screen (24).

10. The method of claim 9, characterized in that the laser beam (18) is pulsed.

11. The method of claim 9 or 10, characterized in that, prior to the marking operation, a charging device (46) transports workpiece (32) into a marking position from which it is removed after the marking operation.

12. The method of claim 11, characterized in that, prior to the marking operation, workpiece (32) is transported on a first roller conveyor (56) in a first direction (Y) up to a first stopper element (58), and is then transported on a second roller (48) in a second direction perpendicular thereto (X) up to a stopped stopper element (50), is marked in this position and is then removed from the marking position in the first direction (Y).

13. The method of claim 12, characterized in that workpiece (32) is held in place in the marking position during the marking operation.

* * * * *